(12) United States Patent
Tucker et al.

(10) Patent No.: US 11,473,846 B1
(45) Date of Patent: *Oct. 18, 2022

(54) ADVANCED COOLING SYSTEM USING THROTTLED INTERNAL COOLING PASSAGE FLOW FOR A WINDOW ASSEMBLY, AND METHODS OF FABRICATION AND USE THEREOF

(71) Applicant: Mainstream Engineering Corporation, Rockledge, FL (US)

(72) Inventors: Brian P Tucker, Melbourne, FL (US); Joshua D. Sole, Rockledge, FL (US); Justin J. Hill, Merritt Island, FL (US); Robert P. Scaringe, Indialantic, FL (US)

(73) Assignee: Mainstream Engineering Corporation, Rockledge, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/360,178

(22) Filed: Jun. 28, 2021

Related U.S. Application Data

(60) Division of application No. 16/838,076, filed on Apr. 2, 2020, now Pat. No. 11,143,459, which is a
(Continued)

(51) Int. Cl.
*F28D 15/00* (2006.01)
*B44C 1/22* (2006.01)
(Continued)

(52) U.S. Cl.
CPC ............ *F28D 15/00* (2013.01); *C23C 16/305* (2013.01); *C23C 16/56* (2013.01); *C30B 25/02* (2013.01);
(Continued)

(58) Field of Classification Search
None
See application file for complete search history.

(56) References Cited

U.S. PATENT DOCUMENTS

| 4,949,920 A | 8/1990 | Schindel et al. |
| 4,978,577 A | 12/1990 | Furohit et al. |
| (Continued) | | |

OTHER PUBLICATIONS

Wojciechowski, et al., Internally Cooled Window for Endoatmospheric Homing, AIAA, May 1992.
(Continued)

*Primary Examiner* — Shamim Ahmed
(74) *Attorney, Agent, or Firm* — Michael W. O'Neill, Esq.

(57) ABSTRACT

A window assembly heat transfer system is disclosed in which a window member has a selected transparency to monitored or sensed electromagnetic wavelengths. One or more passages are provided in the window member for flowing a single-phase or two-phase heat transfer fluid. A mechanism allows either evaporation or condensation of the fluid and/or balancing of a flow of the fluid within the passages. In one embodiment, the window assembly can be made by producing passages in a top surface of a first single plate, optionally producing passages in a bottom surface of a second single plate and bonding the top surface of the first plate to a bottom surface of a second single plate to form the window member with the passage or passages. In another embodiment, the window assembly can be made by providing a core around which the window member material is grown and thereafter removing the core to produce the passage or passages.

20 Claims, 10 Drawing Sheets

Related U.S. Application Data continuation-in-part of application No. 16/745,927, filed on Jan. 17, 2020, now Pat. No. 10,914,529, which is a continuation of application No. 15/478,474, filed on Apr. 4, 2017, now Pat. No. 10,591,221.

(51) Int. Cl.

| | |
|---|---|
| *C23C 16/00* | (2006.01) |
| *C23C 16/30* | (2006.01) |
| *C30B 29/48* | (2006.01) |
| *C23C 16/56* | (2006.01) |
| *C30B 25/02* | (2006.01) |
| *C30B 33/08* | (2006.01) |
| *F42B 15/34* | (2006.01) |
| *F28D 21/00* | (2006.01) |
| *B64C 1/14* | (2006.01) |

(52) U.S. Cl.
CPC .............. *C30B 29/48* (2013.01); *C30B 33/08* (2013.01); *B64C 1/1484* (2013.01); *F28D 2021/0021* (2013.01); *F42B 15/34* (2013.01)

(56) References Cited

U.S. PATENT DOCUMENTS

| | | | |
|---|---|---|---|
| 5,025,856 A | 6/1991 | VanDyke | |
| 5,073,831 A | 12/1991 | Flint | |
| 5,075,797 A | 12/1991 | Jones | |
| 5,145,716 A | 9/1992 | Paserin | |
| 5,291,830 A | 3/1994 | Zwan | |
| 5,403,783 A | 4/1995 | Nakanishi | |
| 6,134,785 A | 10/2000 | Walter | |
| 6,530,539 B2 | 3/2003 | Goldman et al. | |
| 6,943,336 B2 | 9/2005 | Mangoubi | |
| 8,803,088 B1 | 8/2014 | Ravichandran et al. | |
| 2008/0012499 A1 | 1/2008 | Ragay | |
| 2010/0206523 A1 | 8/2010 | Chen et al. | |
| 2013/0306989 A1 | 11/2013 | Kub | |
| 2015/0358558 A1 | 12/2015 | McKenzie | |
| 2017/0211415 A1 | 7/2017 | Swift | |

OTHER PUBLICATIONS

Wojciechowski, et al., Internally Cooled Window for Endoatmospheric Homing, AIAA, Jun. 1993.

Burzlaff, et al., Active Two-Phase Cooling of an IR Window for a Hypersonic Interceptor, AIAA, Jun. 1993.

Pitschmman, et al., Reaction Bonded Silicon Carbide Material Characteristics as Related to Its Use in High Power Laser Systems, Proc. SPIE 9193, Novel Optical Systems Design and Optimization XVII, 919312 (Sep. 12, 2014).

II-VI Incorporated, Reaction Bonded SiC, www.iiviinfrared.com/Optical-Materials/reaction-bonded-SiC.html, accessed Oct. 30, 2019.

Evans, R.W., Design Guidelines for Shielding Effectiveness, Current Carrying Capability, and the Enhancement of Conductivity of Composite Materials, https://ntrs.nasa.gov/search.jsp?R=19970036055, accessed Mar. 26, 2020.

Figure 8a
Figure 8b
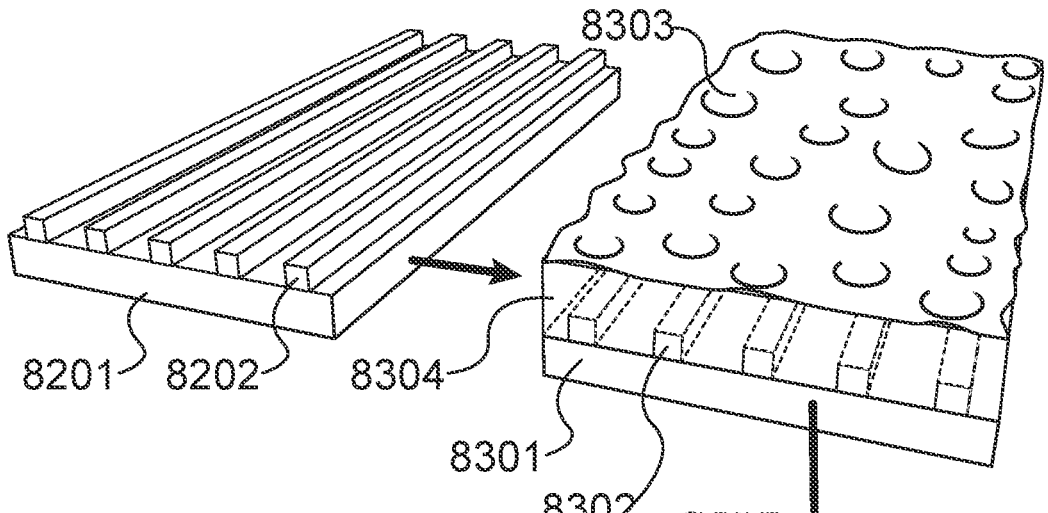
Figure 8d
Figure 8c
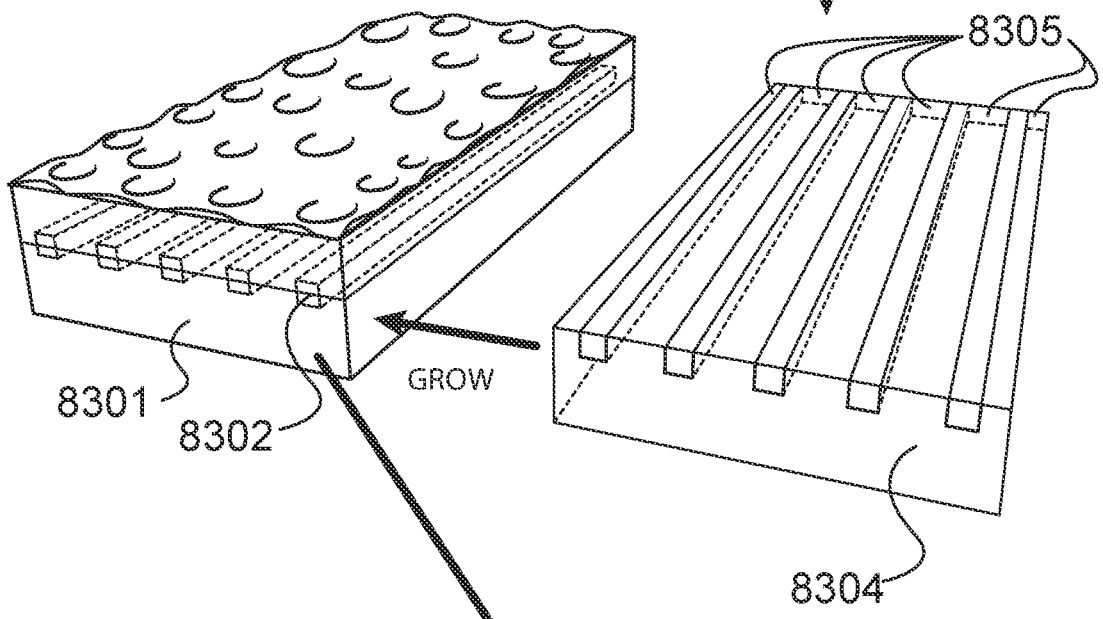
Figure 8e
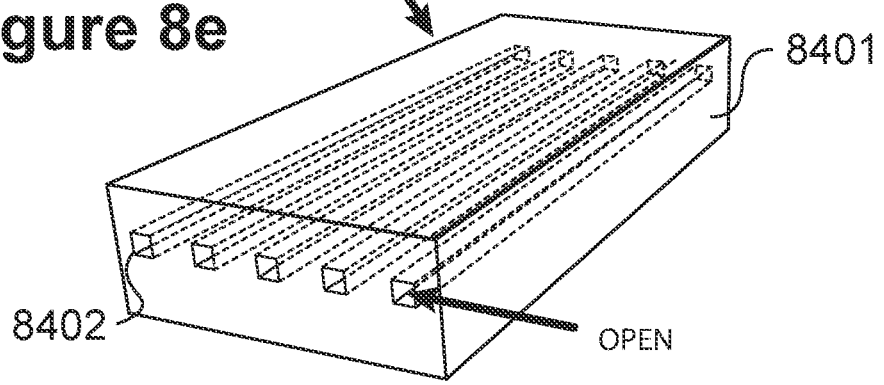

ADVANCED COOLING SYSTEM USING THROTTLED INTERNAL COOLING PASSAGE FLOW FOR A WINDOW ASSEMBLY, AND METHODS OF FABRICATION AND USE THEREOF

CROSS-REFERENCE TO RELATED APPLICATIONS

This application is a divisional of U.S. patent application Ser. No. 16/838,076 which is continuation in part of U.S. patent application Ser. No. 16/745,927, filed on Jan. 17, 2020, and now U.S. Pat. No. 10,914,529, which is a continuation of U.S. patent application Ser. No. 15/478,474, filed Apr. 4, 2017, and now U.S. Pat. No. 10,591,221, each of which is incorporated by reference herein in its entirety.

BACKGROUND AND SUMMARY OF THE INVENTION

The present invention relates generally to thermally controlled systems for the skin or protective surface of a missile, or other aerospace structure that will still allow the transmission of electromagnetic waves through the surface without severe attenuation, while providing thermal control to this aerospace surface via internal heat transfer passages. For example "hypersonic windows" and "the dome section of hypersonic vehicle" where one or more electromagnetic (EM) spectrum wavelengths such as radio frequency (RF), infrared (IR), ultraviolet (UV), and visible wavelengths are desired to be transmitted through this surface and due to the environmental conditions surrounding this surface, the surface is exposed to extremely high and/or low temperatures such that without the necessary heating or cooling, the surface may not survive or performance of the surface would be degraded. The present invention also relates generally to not only putting heat transfer passages in the interior of the surface material for cooling, but also for manufacturing passages or other shapes of voids in the material to alter the electromagnetic transmissivity. This invention discusses manufacturing methods to create these passages or voids as well. In this disclosure, the term window refers to any surface on these aerospace vehicles that allows one or more forms of electromagnetic wavelengths to transmit or see through, such as IR, UV, and RF.

Without cooling IR and RF windows and domes are currently unable to survive the environment experienced by hypersonic vehicles traveling above Mach 3. Window temperatures can exceed 900° C. from exposure to the high heat fluxes and temperatures associated with hypersonic flight. A typical prior art window 102 on a section of a hypersonic vehicle designated generally by numeral 100 employing a sensor 103 (schematically illustrated), such as an IR sensor or RF antenna, is shown in FIG. 1. The high-speed air 104 flows along or against the exterior surface 105 of the window, thereby generating heat which will destroy the window or render the window opaque to the electromagnetic wavelength being sensed or monitored by the sensor 103.

The heating effects of a high-speed/hypersonic vehicle (stagnation temperatures up to 1,500° C.) associated with high-speed/hypersonic flight pose a difficult environment for RF sensors including RF guidance sensors. The interface surface or window material must be able to withstand the exposure to high temperatures while affording transparency in the sensor's electromagnetic spectrum of operation. Therefore, the window must be actively cooled. Terminal homing seeker hypersonic vehicles tend to have a forward-looking field-of-view, requiring an ogive-shaped window or radome that must endure the high stagnation temperature of these speeds, and the high dynamic pressures (2,000-12,000 lbs./sq. ft.) so the materials must also have structural strength, which of course would degrade without cooling.

Optical and infrared windows and domes used in hypersonic aircraft, missile systems, and spacecraft for infrared imaging or other wavelength imaging demand good mechanical stability and high optical transmission in the wavelength range of the sensor that is viewing through the window. For infrared sensors, the wavelength range is typically between 0.4 micron and 12 microns. Zinc sulfide, zinc selenide, germanium, gallium arsenide, gallium phosphide, and cadmium telluride are used in applications such as IR windows which require long wavelength infrared (LWIR) optical transmission capability. The fabrication of zinc sulfide and zinc selenide via chemical vapor deposition (CVD) routes is one possible pathway. Alternatively, IR windows can be produced by forming a green body from a population of nanoparticles, depositing a layer of ZnS powder and sintering the covered green body to produce a sintered product.

RF windows and domes are unable to operate on hypersonic vehicles because of issues with thermal shock resistance, oxidation, and changes to dielectric constant at high temperature. Antennas amplify signals ranging from 0.003-300 GHz. Materials such as fused silica, Pyroceram 9606, and silicon nitride are used as windows and domes for RF applications that must protect the antenna and electronics from an extreme environment. Fabrication methods include sintering, hot pressing, and chemical vapor deposition.

One known window assembly consists of an outer window and inner window with an intervening space which can be filled by a material characterized by high thermal insulation properties or, alternatively, a cooling fluid is circulated through an intervening space so that, the entire intervening space between the outer and inner windows is filled with either an insulating gas or a cooling fluid. There are significant drawbacks to this approach. Since the sensor must look through the cooling or insulating fluid in the intervening space, the inner window is coated with an optical coating that is substantially transparent at the visible and/or the infrared frequency portion of the electromagnet spectrum to reduce reflections because the two liquid-to-window interfaces can cause reflection or variation of the wavelength, resulting in noise in the IR signal and reduced quality. Yet another drawback of this type of assembly is that, because the interior flow cross-section created by the intervening space is simply a wide-open unsupported area, it has less of an ability to withstand a large pressure gradient between the fluid in the intervening space and the interior or exterior of the window. Also, the open flow cross-section of the intervening space means that there are no defined flow passages or flow paths in intervening space, but rather only an open cross-section. Therefore, without any such flow constraints, uniform flow across the intervening space is problematic in that fluid flow can be expected to take the shortest path from the inlet to outlet, leaving other areas with little or no flow, resulting in large temperature variations across the window. While this type of prior art proposed the coolant as a single-phase liquid or gas, flow maldistribution would have been an even greater problem if an evaporating fluid had been contemplated, because the highly variable g-forces experienced in a hypersonic vehicle or missile will further exacerbate this flow maldistribution and potential flow instabilities. This is because the inertial effects on the liquid and vapor in the coolant passage will be different.

Another known window assembly includes an inner window, an outer window, and a support subsystem between the inner and outer windows defining a plurality of infrared transparent fluid flow cooling channels for cooling the outer window without adversely affecting the electromagnetic properties (at the wavelengths of interest) of either window. Like the assembly just discussed, this second known approach also proposes to have transparent fluid flow heat transfer passages. We have recognized, however, that it is disadvantageous for wavelengths of interest for the sensor to be transmitted through the heat transfer passages as that will adversely affect the sensor data and also that opaque heat transfer passages are a solution to that problem. We have also realized that for the shape and location of the heat transfer passages and even the coolant being used can be used to "dope" or alter the overall surface averaged transmissive properties of the material, that is, the effect of some level of transmissivity between being fully transmissive and fully opaque may be desirable for RF sensor applications.

A conceptual silicon window cooled using single-phase water has also been described by *Wojciechowski* et al (Internally Cooled Window for Endoatmospheric Homing, AIAA, May 1992). We have found, however, that the use of single-phase water causes undesirably lower heat transfer coefficients and requires equally undesirable large mass flow rates to maintain a uniform temperature. Furthermore, the silicon cooled window concept is only applicable to MWIR since silicon substrate absorbs in LWIR.

Zinc sulfide is a common material for LWIR and semi-active laser windows and domes. Multi-spectral zinc sulfide (ZnS), made by CVD, is also commercially available. A sintering process is believed to produce a more erosion-resistant and ultra-high density IR window. Regardless of the base material being used, or the manufacturing process used to form these windows, they must be actively cooled because of the very high thermal loads that result from the high-speed airflow over the exterior during flight. Currently available IR window materials are still unable to withstand the heat fluxes and temperatures associated with these conditions. Future missile performance improvements will be impeded without the development of advanced cooling strategies for high-speed weapon windows and radomes.

We have discovered a way to address these problems by employing an internally cooled window that uses two-phase flow in one or more channels having hydraulic diameters less than about 0.118 inch (3 mm) within the window to maintain both a uniform temperature, a low mass flow rate (relative to single-phase flow which results in lower pressure drops) and a low temperature while also minimizing system size. The passages can have some level of non-transmissivity to a monitored or sensed electromagnetic wavelength. For IR sensors we have found the preferred embodiment to be completely non-transparent, while for RF sensors some level of non-transparency in the windows can be useful to provide an overall average RF transparency of the entire window. That is the passages or voids can be used not only for cooling but also to affect overall RF sensor transmittance over a particular wavelength. An inlet flow restriction or valve such as a orifice, weir (or any form of reduction of the cross-sectional flow area, that is essentially any obstruction which reduces the cross-sectional flow area thereby reducing the passage hydraulic diameter in this location), capillary tube section, reduced hydraulic diameter section or adjustable throttling valve (such as a thermostatic expansion valve (TXV) or electronic expansion valve (EXV)) is provided at the inlet of each flow passage in the electromagnetic window or radome to act as a throttling device upstream of the evaporation section of the heat transfer passages which will, for two-phase evaporating coolants, initiate adiabatic nucleation (i.e., evaporation) and prevent boiling (evaporation) hysteresis. This flow restriction will also act as a flow balancing mechanism for two-phase coolant flow and even single-phase coolant flow, since the pressure drop across this restriction will substantially exceed pressure drops due to the flow down an individual passage, pressure variations due to orientation, and pressure variations due to external g-forces. The pressure drop of the flow restriction will make perturbations in the pressure drop in the coolant passageway (i.e., for two-phase flow perturbations potentially resulting from variations in the thermodynamic quality due to variations in heat loading applied to the window, for single-phase flow perturbations potentially resulting from varying surface roughness,) insignificant relative to the pressure drop across this upstream throttling device. This throttling device can be located at the inlet of the window, at the interface between the window and the inlet flow manifold or at the exit of the inlet manifold. Such a configuration keeps the flows in balance at the design flow rates, regardless of changes in g-forces, orientation, and thermodynamic flow quality due to non-uniform heat loading on the coolant passages or the window itself. In addition, for two-phase flow, either an upstream (upstream of the window) control or throttling valve can be used along with the passage flow restrictions to control the superheat or quality exiting the actively cooled window. As part this discovery process, we have considered the effects of material electromagnetic wavelength absorption and emission, channel emission, channel diffraction, and temperature-induced wavefront deformation. At the same time, we have discovered as well, a novel method to fabricate these windows with internal heat transfer passages for using either single-phase or two-phase flow cooling. One of many advantages of our discoveries is that they provide significantly better performance than any previous internally cooled window that has been demonstrated in the prior art such as those which use two-phase ammonia impinging onto a porous cover and venting coolant directly in front of the window (which can significantly degrade image quality) or require bonding of the window, a stainless-steel coolant tube, and a porous cover.

In the next section, we provide a brief description of the drawings.

BRIEF DESCRIPTION OF THE DRAWINGS

These and other objects, features and advantages of our invention will become more readily apparent from the following detailed description when taken in conjunction with the accompanying figures wherein:

FIGS. 8(a)-(e) shows another embodiment of a method according to our invention to obtain the same result as in FIG. 7(a)-(d) but with removal of the polishing step between the two CVD growth steps to form the inner channel material around the core material.

DETAILED DESCRIPTION OF THE DRAWINGS

Figure 1:
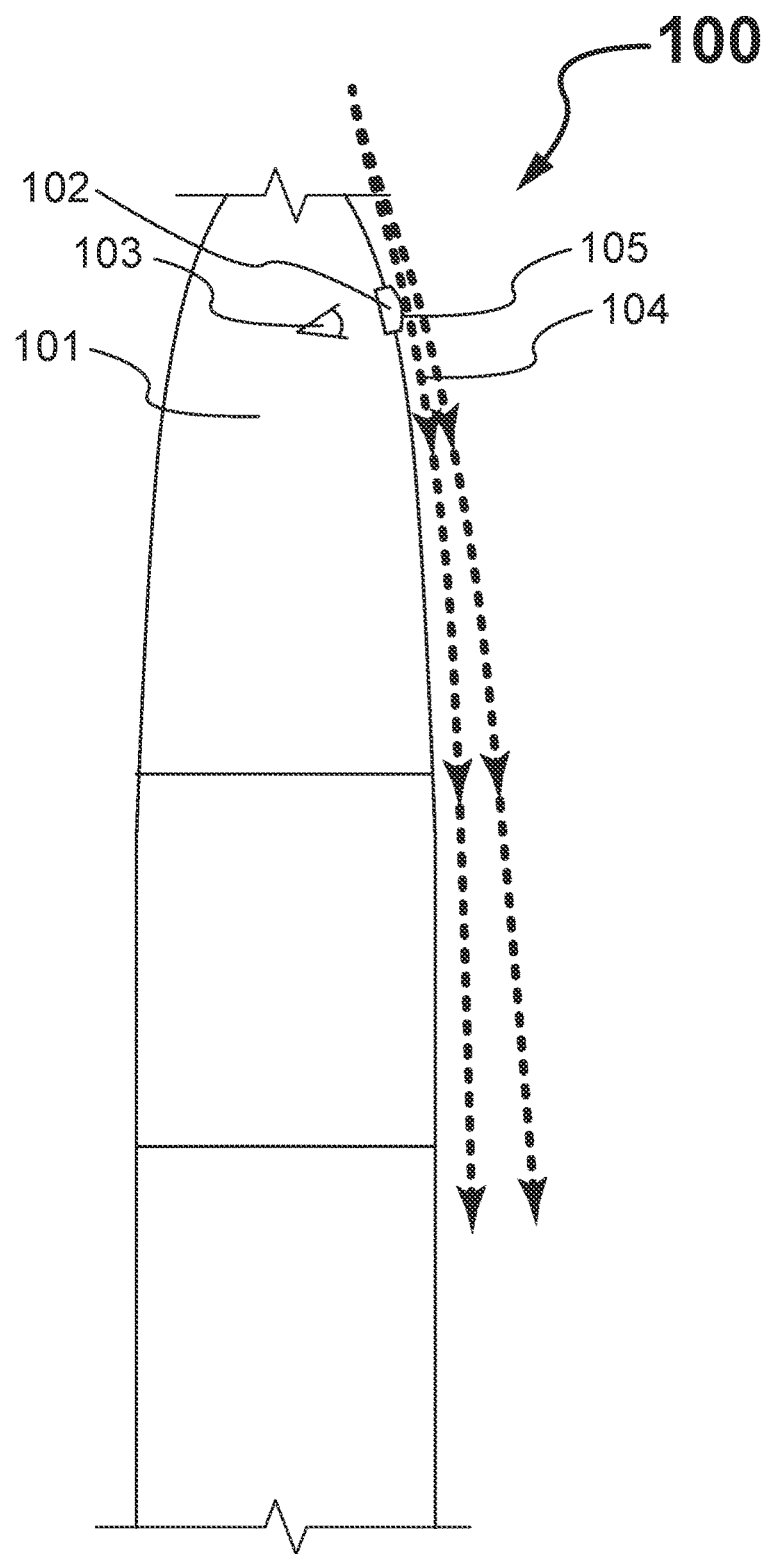
FIG. 1 depicts a known type of electromagnetic window used as part of a section of a hypersonic vehicle, such as a missile, rocket or high-speed airplane, or high-speed unmanned aerial vehicle (UAV) drone employing a sensor which views through the electromagnetic window as above described.
Figure 2A:
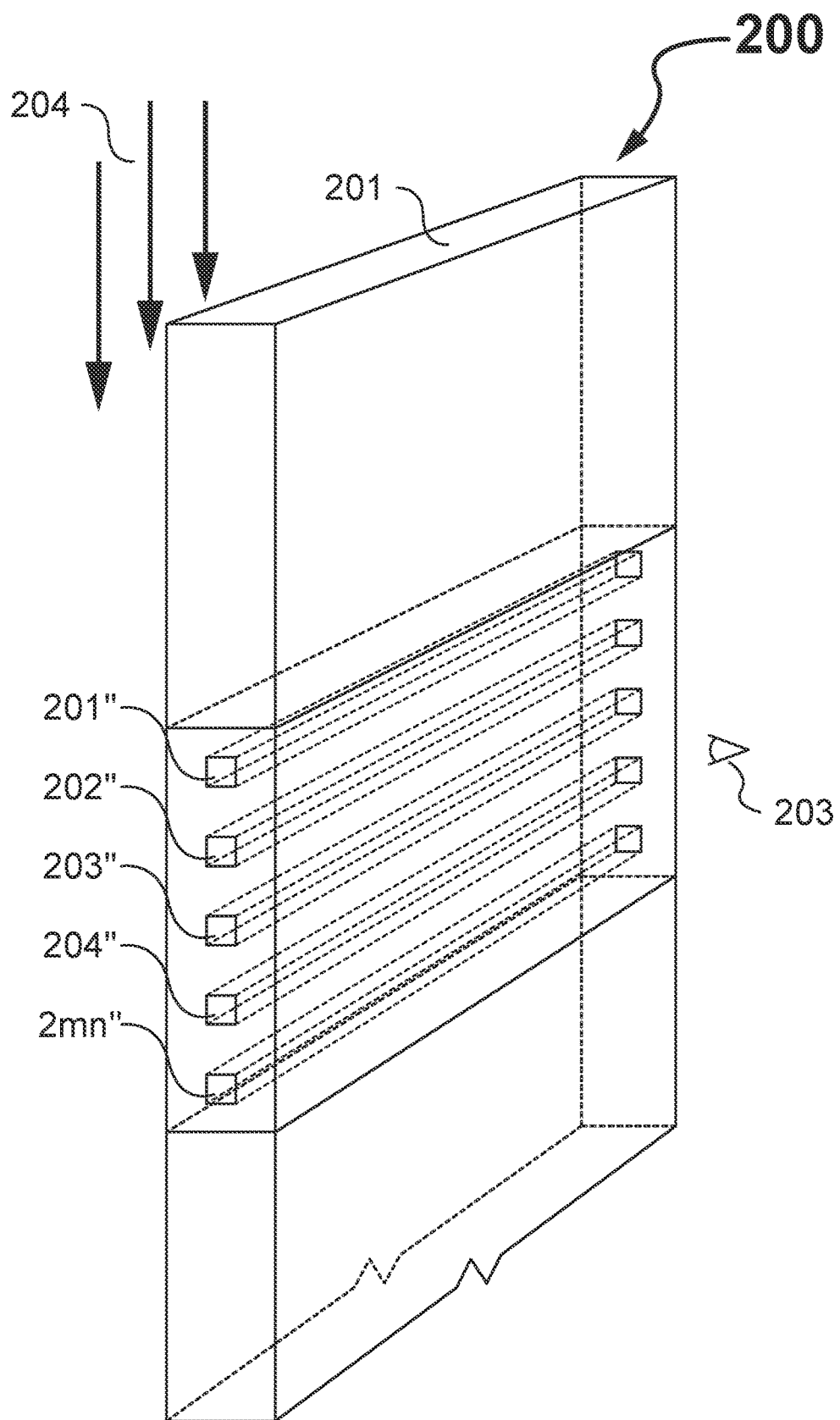
FIGS. 2*a*, 2*b* and 2*c* are, respectively, embodiments of an actively cooled EM spectrum window, including RF or IR windows or radomes used on hypersonic vehicles, such as a missile, rocket, high speed airplane, or high-speed UAV employing a sensor which views through the actively cooled window which has parallel-flow passages, series-flow passages or a combination of parallel-and series-flow passages.
Figure 2B:
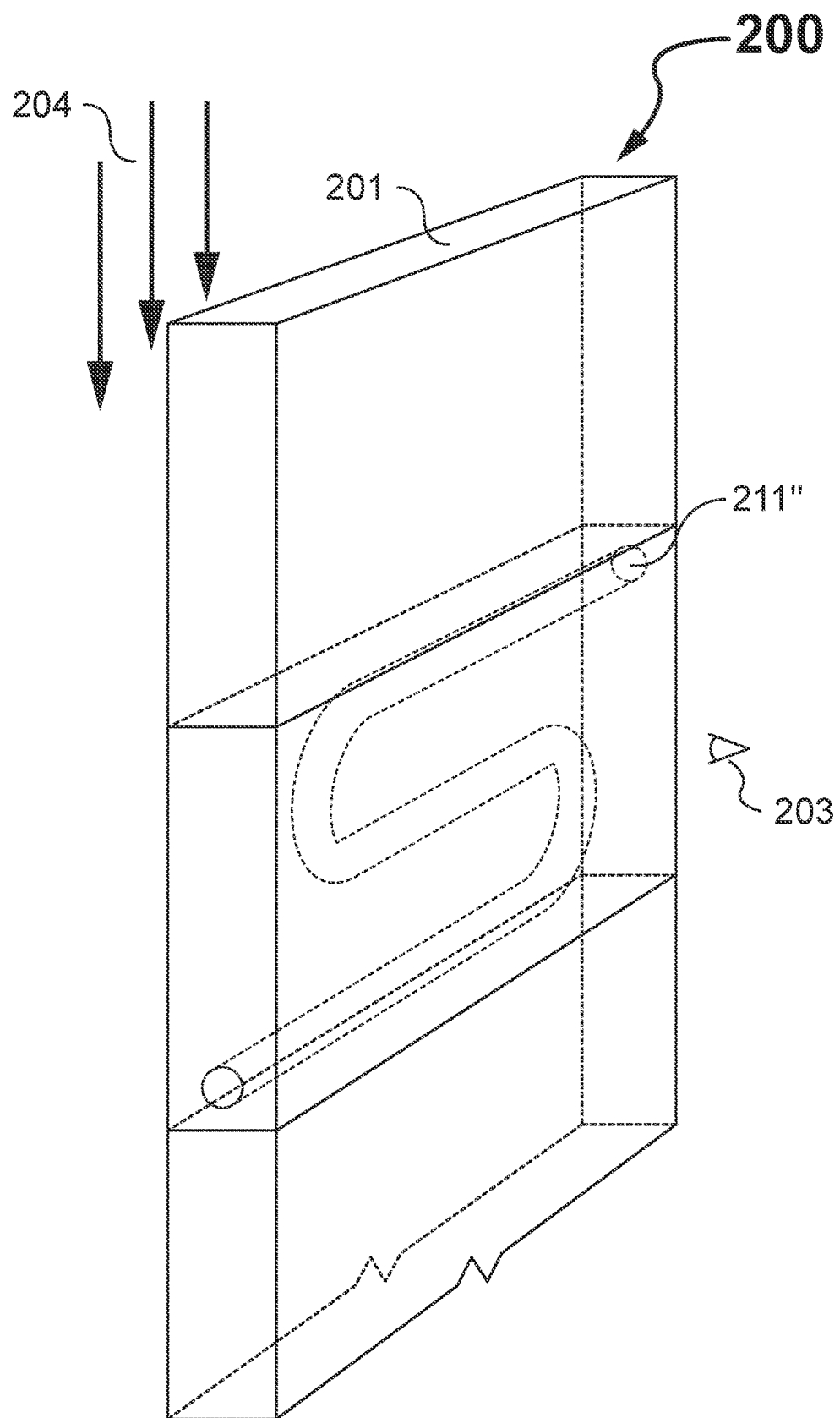
Figure 2C:
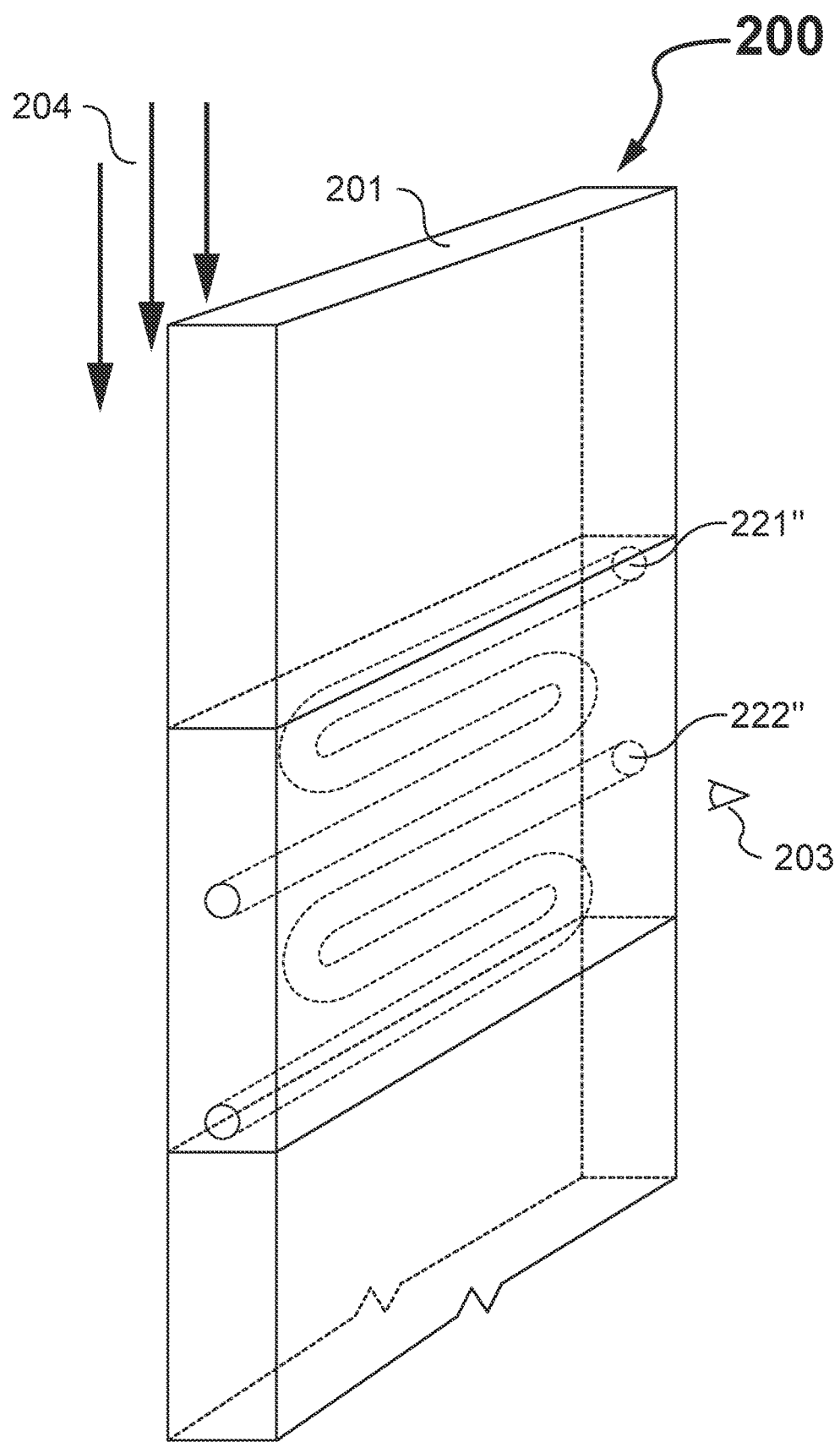

An embodiment of a novel window or radome designated generally by numeral 200 in accordance with our invention is shown in FIG. 2a. Once again, hypersonic or simply high speed airflow 204 over or against the outer surface causes heat generation on the vehicle surface and the window. We recognized that to keep the window or radome from failing or preventing distortion in the transmission of electromagnetic signals to a sensor or antenna 203 (schematically shown) requires that the window or radome be actively cooled. In this currently contemplated embodiment of the present invention, one or more heat transfer passages 201"-2mn" (mn being used herein to designate the last of any number of desired parts in a series) are arranged inside the window 200 to provide cooling to maintain the window at a survivable temperature, so that near isobaric evaporation of the coolant inside the passages 201"-2mn" also provides near isothermal temperature distribution given that the evaporation temperature is directly related to the evaporation pressure which is nearly isobaric. This nearly uniform temperature distribution translates into less thermal distortion of the wavelength being observed by the sensor 203. A small restrictor or adjustable throttling valve can be arranged at the entrance to each passage (shown in FIGS. 3, 4 and 5) or, alternatively, in an interface between a manifold and the entrance of the passages to act as a throttling device upstream of the evaporation section of the heat transfer passages to initiate nucleation and also as a flow balancing system to prevent flow instabilities, such as manometer tube parallel-path flow oscillations to name but one possible flow instability being prevented. The sensor 203 can, for example, be a long wavelength Infrared (LWIR) sensor, medium wavelength infrared (MWIR) sensor, a short wavelength infrared (SWIR) sensor, an RF sensor, a visual sensor or camera, or a radar antenna. It will now be understood in the art that, while only parallel-flow passages have been shown as an exemplary embodiment, series-flow passages (211" in FIG. 2b) or combinations of series- and parallel-flow passages (221", 222" in FIG. 2c) can also be used within the scope of the present invention.

In one currently preferred embodiment of our invention, the actively cooled window is one of an EM spectrum, (such as RF, visual or IR) window cooling system which is cooled by the evaporation of the coolant flowing through the window and can be configured in either a closed-loop or open-loop system. Of course, it will now be appreciated by one skilled in this art that all types of windows and radomes that permit all wavelengths from the EM spectrum can employ the present invention, and that a window transparent to LWIR and RF are perhaps the most challenging applications of our technology due to limited available material options and the processing abilities of those available materials.

Figure 3:
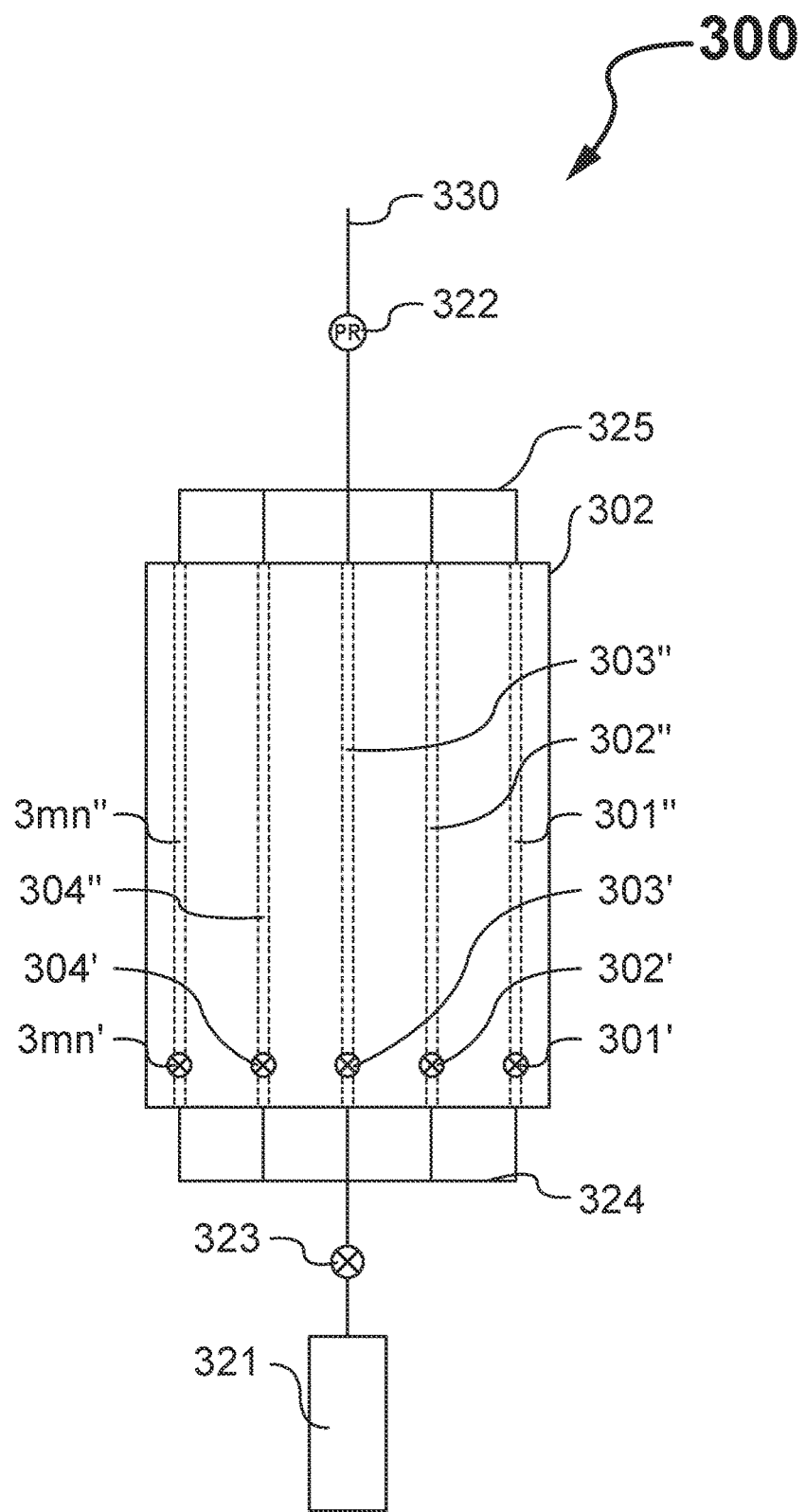
FIG. 3 is a schematic drawing of an open-loop EM spectrum window or radome cooling system configuration where liquid coolant stored in the reservoir flows through the passages in the cooled window to prevent any thermally related damage to the window.

With regard to the type of window assembly shown in FIG. 2a, an open-loop EM spectrum window cooling system configuration designated generally by numeral 300 is shown in FIG. 3 where coolant stored in a reservoir 321 flows through an optional control or throttling valve 323 then enters an inlet flow distributing manifold 324 before being directed into the individual flow passages 301" through 3mn" located inside the EM spectrum window 302. An inlet flow restriction or valve 301' through 3mn' such as a orifice, weir, capillary tube section, reduced hydraulic diameter section or adjustable throttling valve (such as a TXV or EXV) is provided at the inlet of each flow passage in the window to act as a throttling device upstream of the evaporation section of the heat transfer passages 301" through 3mn" which will initiate adiabatic nucleation (i.e., evaporation) and prevent boiling (evaporation) hysteresis, and also to act as a flow balancing system since the pressure drop across this flow restriction will outweigh the pressure drops due to the two-phase flow down an individual passage, thereby making perturbations in the pressure drop in the two-phase coolant passageway (potentially as a result of variations in the thermodynamic quality) insignificant relative to the pressure drop across this upstream throttling device. This throttling device can be located at the inlet of the window (or radome), at the interface between the window and the inlet flow manifold or at the exit of the inlet manifold. Even if a single-phase coolant fluid is used as the cooling fluid in the embodiments disclosed herein and contemplated as part of our inventive concept, such a configuration keeps the flows in balance or at the design flow rates, regardless of variations in g-forces, orientation, and thermodynamic flow quality (caused by non-uniform heat loading on the coolant passages or the window itself). Either the optional control or throttling valve 323 or the individual flow restrictions 301' through 3mn' or both can be used to control the superheat or quality exiting the open loop system at the outlet to the environment 330. In a currently preferred embodiments of our invention, a variety of two-phase coolants or mixtures thereof including water, ammonia, liquid nitrogen, liquid helium, liquid neon, liquid argon, liquid krypton, liquid xenon and other liquefied gases as well as conventional refrigerants including hydrofluorocarbon (HFC) refrigerants, perfluorocarbon refrigerants, hydrocarbon (HC) refrigerants and hydrofluro-olefin (HFO) refrigerants can be used in this configuration as one skilled in the art will now recognize.

The coolant evaporates either partially or completely and then exits the individual heat transfer passages 301" through 3mn" being combined in an exit flow manifold 325 before flowing into an optional evaporation pressure regulator 322 and then vented either overboard 330 or internally to the vehicle carrying the window assembly. It is well understood by one skilled in the art that the evaporation pressure regulator could be replaced by a temperature or flow regulating valve or that a combination of pressure, temperature and flow can be used to determine the position of the valve 322. It is also understood that the overall cooling could be initiated by opening either valve 323 or 322 and terminated by the complete closing of either valve 323 or 322. Also, the person of skill in the art will understand the greater thermal inertia and thermal capacity that is provided to the EM window if valve 322 is used the control turn on and turn off when compared to using valve 323 to perform those functions. Likewise, one versed in the art will understand that lower pressure is developed in the window heat transfer passages if valve 323 is used the control turn on and turn off as compared to using valve 322 to perform those functions. It is also contemplated that the valve used to turn on the flow such as valve 322, 323 or both could be replaced by a thermal plug or fusible plug that opens or melts-open when exposed to the high temperatures of flight, thereby simplifying the control system necessary to initiate cooling of the hot window or radome.

Figure 4:
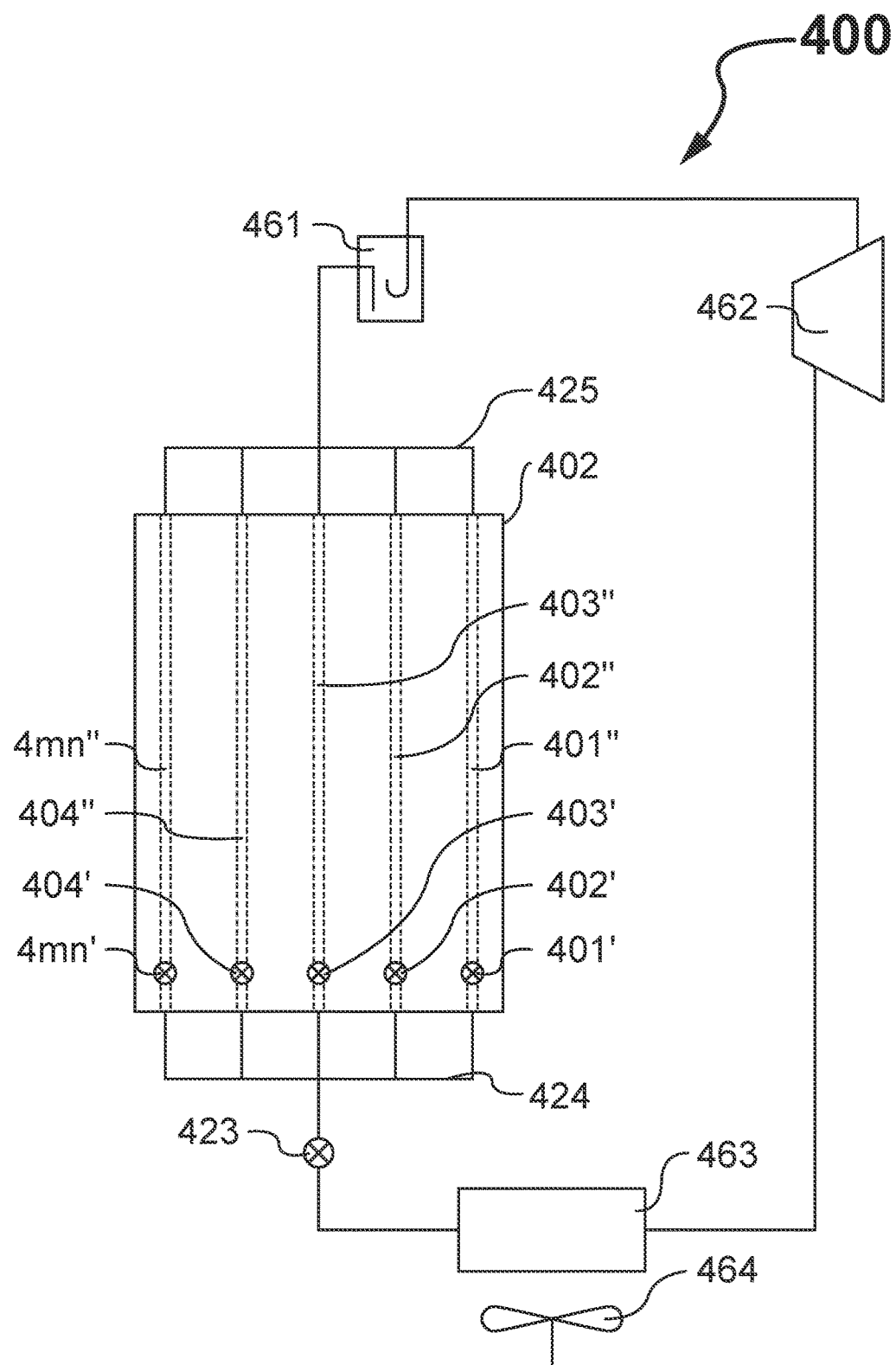
FIG. 4 is a schematic drawing of a closed-loop EM spectrum window or radome cooling system configuration where liquid coolant in the actively cooled window is the evaporator of a vapor compression cooling loop.
Figure 5:
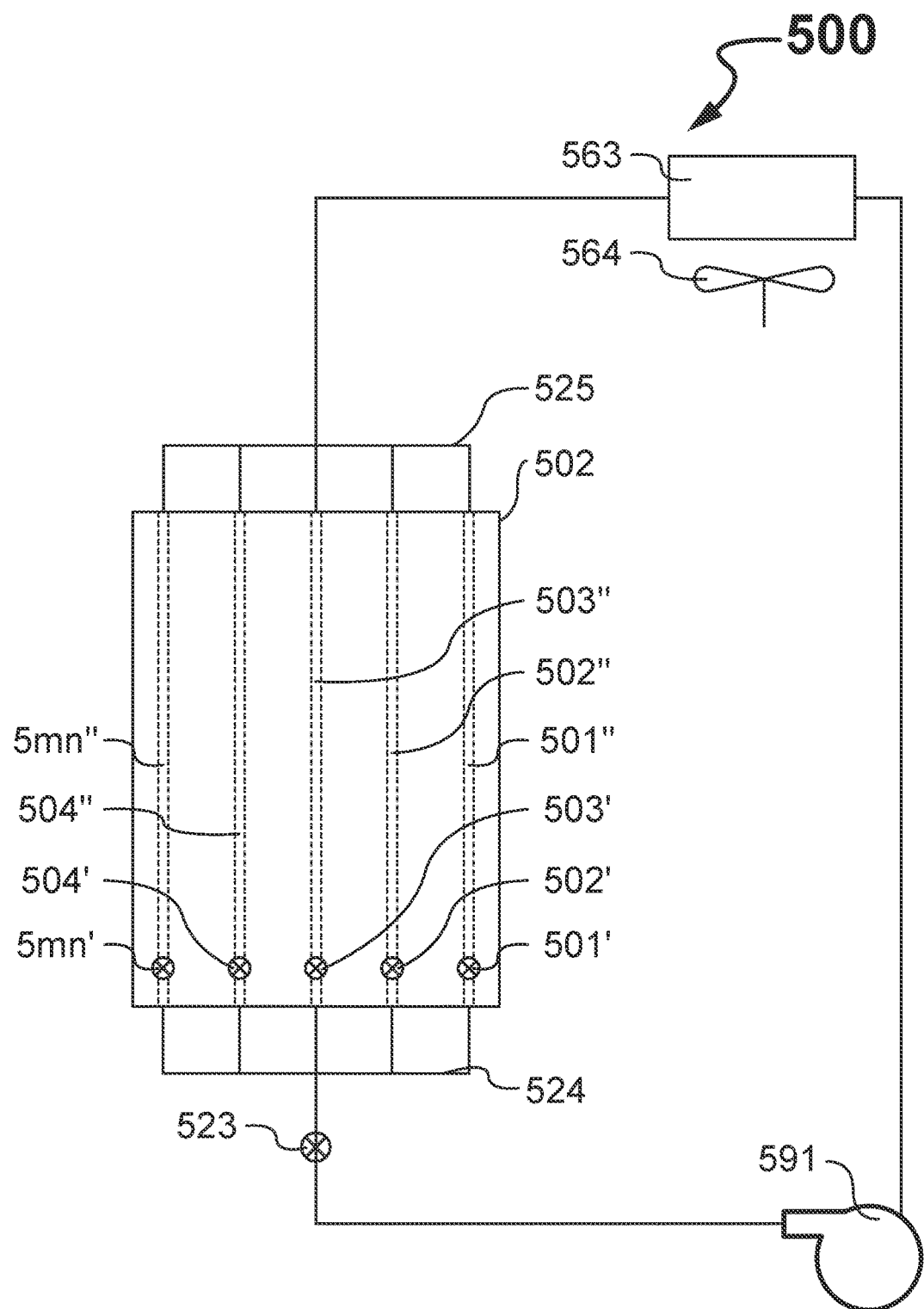
FIG. 5 is a schematic drawing of a closed-loop pumped two-phase EM spectrum window or radome cooling system configuration where liquid coolant in the actively cooled window is the evaporator of a pumped two phase thermal control loop.

FIG. 4 displays another embodiment of our closed-loop EM spectrum window cooling system configuration designated generally by numeral 400 where liquid coolant flowing from a condenser 463 flows through an optional control or throttling valve 423 then enters an inlet flow distributing manifold 424 before being directed into individual flow passages 401" through 4$mn$" located inside the window 402. At the inlet of each flow passage in the window there is an inlet flow restriction or valve 401' through 4$mn$' such as a orifice, weir (partial dam of the cross-sectional flow area), capillary tube section, reduced hydraulic diameter section or adjustable throttling valve (such as a TXV or EXV) to act as a throttling device upstream of the evaporation section of the heat transfer passages 401" through 4$mn$" which will initiate adiabatic nucleation (i.e., evaporation) and prevent boiling (evaporation) hysteresis and also act as a flow balancing system since the pressure drop across this restriction will outweigh the pressure drops due to the two-phase flow down an individual passage, thereby making perturbations in the pressure drop in the two-phase coolant passageway (potentially as a result of variations in the thermodynamic quality) insignificant relative to the pressure drop across this upstream throttling device. This throttling device can be located at the inlet of the window, at the interface between the window and the inlet flow manifold or at the exit of the inlet manifold. Again, even if a single-phase coolant is used, such a configuration keeps the flows in balance or at the design flow rates, regardless of changes in the thermodynamic flow quality due to non-uniform heat loading on the coolant passages or the window itself. Either the control or throttling valve 423 or the individual flow restrictions 401' through 4$mn$' or both can be used to control the superheat or quality exiting an exhaust manifold 425. The evaporated coolant leaving the cooled window 402, hereafter also referred to as the refrigerant, will then flow to a suction line accumulator 461 to assure that only superheat refrigerant vapor enters a compressor 462. If the refrigerant exiting the window 402 via the exhaust manifold 425 is typically always saturated and not superheated, then a pumped two-phase loop configuration such as shown in FIG. 5 can be used instead of the vapor compression system shown in FIG. 4, or heat can be added to the suction line accumulator 461 (or heat added to an additional heat exchanger or recuperator upstream of the compressor 462) prior to the compression of the refrigerant vapor to avoid the steady-state injection of incompressible liquid refrigerant by the compressor 462. Alternatively, if the refrigerant flow exiting the exhaust manifold 425 is typically superheated or is assured to be superheated by feedback control of this information by either the optional control or throttling valve 423 and/or the individual flow restrictions 401' through 4$mn$' or both then the superheat of refrigerant normally exiting the exhaust manifold 425 or exiting the passages before entering the exhaust manifold will evaporate any transient saturated liquid that may enter the suction line accumulator, due to transient operation. In this way, any short-term transient liquid, due to the rapid changing of power levels or valve settings can be accommodated by the temporary hold-up of this liquid refrigerant in the suction line accumulator 461. A variety of two-phase coolants or refrigerants including water, ammonia, liquid nitrogen and other liquefied gasses as well as numerous potential conventional HFC, HFO and HC refrigerants can be used in this configuration as one skilled in the art will now recognize. However, our currently preferred embodiment of two-phase cooling employs two-phase evaporation of water.

The condenser 463 shown in FIG. 4 is air cooled, and the air flow through the condenser can be increased with an optional fan or blower assembly 464. One skilled in the art will understand, however, that this air-cooled condenser can be replaced by a liquid cooled condenser within the scope of our invention. It is also understood that a typical vapor compression system has other common and well-known components such as a filter-drier, high and low pressure safety controls, and liquid receiver to name just a few that would be present in any typical vapor compression system.

FIG. 5 displays yet another embodiment of our invention in the form of a closed-loop pumped two-phase EM spectrum or RF or IR window cooling system configuration designated generally by numeral 500 where liquid coolant flowing from a pump 591 through an optional control or throttling valve 523 then enters an inlet flow distributing manifold 524 before being directed into the individual flow passages 501" through 5$mn$" located inside a window 502. At the inlet of each flow passage in the window there is an inlet flow restriction or valve 501' through 5$mn$' such as a orifice, weir, capillary tube section, reduced hydraulic diameter section or adjustable throttling valve (such as a TXV or EXV) to act as a throttling device upstream of the evaporation section of the heat transfer passages 501" through 5$mn$" which will initiate adiabatic nucleation (i.e., evaporation) and prevent boiling (evaporation) hysteresis and also act as a flow balancing system since the pressure drop across this restriction will outweigh the pressure drops due to the two-phase flow down an individual passage, thereby making perturbations in the pressure drop in the two-phase coolant passageway (potentially as a result of variations in the thermodynamic quality) insignificant relative to the pressure drop across this upstream throttling device. This throttling device can be located at the inlet of the window, at the interface between the window and the inlet flow manifold or at the exit of the inlet manifold. Such a configuration keeps the flows in balance or at the design flow rates, regardless of changes in the thermodynamic flow quality due to non-uniform heat loading on the coolant passages or the window itself. Either the control or throttling valve 523 or the individual flow restrictions 501' through 5$mn$' or both can be used to control the superheat or quality exiting an exhaust manifold 525. The two-phase or superheated refrigerant (coolant), leaving the cooled window 502 will then flow to a condenser 563. Only liquid refrigerant should exit the condenser 563 so that it can be pumped, without cavitation, by the liquid pump 591. The condenser 563 shown is air cooled in the illustrated embodiment and the air flow through the condenser 563 can be increased with an optional fan or blower assembly 564. One skilled in the art will again understand that an air-cooled condenser can be replaced by a liquid cooled condenser within the scope of our invention. It is also understood that a typical two-phase pumped loop system has other well-known common components such as a pressurizer and liquid receiver to prevent pump cavitation and to control the condensation and resulting evaporation temperatures to name just a few that would be present in any modern two-phase pumped loop system. One skilled in the art will now further recognize that a single-phase pumped cooling loop could also be employed within the scope of our invention instead of our currently preferred pumped two-phase cooling loop using, by way of example only, water. The pumping power in the single-phase pumped cooling system would, however, be greater due to the requirement for additional mass flow rate of the single-phase coolant. A variety of two-phase coolants or refrigerants including water, ammonia, liquid nitrogen and other liquefied gasses as well as numerous potential conventional HFC, HFO and HC refrigerants can be used in this configuration as one skilled in the art will also now recognize.

We have investigated materials that can be fabricated with internal heat transfer passages and used for our active cooling window as shown in Table 1 below. Unfortunately, most materials that transmit LWIR are also incapable of handling the high temperatures and stresses associated with hypersonic flight so active cooling is necessary. It is well known in the art that candidate materials that do not absorb LWIR at all are diamond, germanium, zinc selenide, and gallium arsenide. Germanium is unsuitable for a hypersonic environment because free-carrier absorption renders the window useless above 100° C. and a high thermo-optic coefficient ($400 \times 10^{-6}$/° C.) significantly distorts the signal during high heat fluxes. Zinc selenide (ZnSe) is generally considered unsuitable for supersonic applications because its low hardness makes it very susceptible to erosion. However, its low thermo-optic distortion makes it an excellent material for applications that do not require durability. Gallium arsenide (GaAs) is a good candidate if the window temperature remains below the free-carrier absorption limit of 400° C., and also has the capability to be used in the MWIR wavelength region. However, GaAs is susceptible to wavefront deformation because of a high index of refraction change with temperature (dn/dT=$150 \times 10^{-6}$/° C.) and low thermal conductivity (48 W/m-K). Of course, our two-phase active thermal control is able to reduce the temperature gradient of the window, thereby mitigating electromagnetic distortion. As was known prior to our invention, diamond is an ideal material for the hypersonic environment in that it has the best thermal conductivity, lowest thermo-optic coefficient, and highest hardness but its use is currently limited by cost, availability, and a maximum temperature of 700° C. (as set by the oxidation limit).

Since some absorption of the electromagnetic signal can be tolerated, five additional materials can be considered. Float zone silicon (FZ-Si) offers high erosion resistance and strength and has previously been used. Gallium phosphide (GaP) provides good erosion resistance and minimal wavefront deformation but has high LWIR absorption and is not commercially available. ZnS offers improved erosion resistance relative to ZnSe at the cost of increased temperature-induced wavefront distortion and a decrease in performance from absorption. Tuftran™ (ZnSe with a ZnS coating), combines the low absorption of ZnSe with the improved erosion resistance of ZnS. However, the low strength and thermal conductivity of the ZnSe layer leads to problems with thermal shock at high heat fluxes. The mismatch in the thermal expansion coefficients of the two materials also can lead to delamination of the layers. Finally, our currently preferred embodiment for a LWIR window uses multi-spectral Zinc Sulfide (ms-ZnS) which is sold under the registered trademark "CLEARTRAN"® of Dow Chemical and is formed by modifying ZnS to be water free by a hot isostatic pressing process because it removes most LWIR absorption and all MWIR absorption at, however, the expense of some reduced strength and hardness. Gallium arsenide (GaAs) is another good candidate for MWIR windows as long as the window temperature remains below the free-carrier absorption limit of 400° C., which of course is possible with the active thermal control disclosed in this invention.

TABLE 1

Properties of LWIR Window Materials

| Property [Units] | Germanium | ZnSe | GaAs | Diamond | Float Zone Silicone | Gallium Phosphide | ZnS | ms-ZnS |
|---|---|---|---|---|---|---|---|---|
| Thermal Conductivity [W/m-K] | 59 | 18 | 48 | 2000 | 159 | 110 | 17 | 27 |
| dn/dT | 408 | 61 | 149 | 15.6 | 150 | 137 | 41 | 54 |
| Strength [MPa] | 93 | 55 | 138 | ≈300 | 125 | ≈100 | 103 | 69 |
| Maximum Temperature [° C.] | 100 | 400 | 700 | 260 | 600 | 600 | 600 | |
| Absorption in MWIR at Room Temperature | No | No | No | Very High | No | No | High | No |
| Absorption in LWIR at Room Temperature | No | No | No | No | High | High | Moderate | Low |
| Commercially Available | Yes | Yes | Recently | High Cost | Yes | No | Yes | Yes |
| Knoop Hardness [kg/mm$^2$] | 692 | 105 | 750 | 8260 | 1150 | 840 | 210 | 150 |

Many of the materials listed in Table 1 above also perform well in the MWIR band. The ms-ZnS is also a good MWIR material because it does not absorb at all in this region. If improved performance is desired, FZ-Si also does not absorb in the MWIR region while offering higher mechanical strength and a higher thermal conductivity (less coolant channel blockage because channels can be spaced further apart). Additional MWIR-only materials are listed in Table 2 below. Sapphire is desirable because of its thermal conductivity, hardness, and strength. However, it also absorbs significantly at high temperatures. At 427° C., a 2 mm thick sapphire window has an emittance of 0.34, which can significantly affect performance. Yttria has minimal high-temperature absorption but has issues with thermal shock because of low thermal conductivity and relatively low strength; it is also not yet commercially available. We currently contemplate using one or more of the above materials in forming the window according to the processes described hereinbelow.

RF materials are listed in Table 3. Microwave absorption is characterized by the loss tangent while reflective losses are characterized by the dielectric constant. Fused silica has a very low loss tangent and low dielectric constant but has relatively poor thermal shock resistance because of low thermal conductivity. Silicon nitride has high thermal shock resistance but relatively high losses from absorption and reflection. ZnS has relatively poor RF properties, but has the capability to operate in RF, MWIR, and LWIR. Most of these materials oxidize in air when exposed to temperatures over 1000° C.

TABLE 2

Properties of MWIR Window Materials

| Property (Units) | Yttria | Sapphire | ALON | Spinel | MgF$_2$ |
|---|---|---|---|---|---|
| Thermal Conductivity [W/m-K] | 13.5 | 36 | 12.6 | 14.6 | 14.7 |
| dn/dT | 30 | 6-12 | 2.8 | 3 | 1 |
| Strength [MPa] | 160 | 300 | 300 | 190 | 125 |
| Maximum Temperature [° C.] | — | — | — | — | — |
| Absorption in MWIR at Room Temperature | Low | Moderate | Moderate | Very High | Low |
| Absorption in LWIR at Room Temperature | Very High | 100% | 100% | 100% | Very High |
| Commercially Available | Yes | Yes | Recently | High Cost | International |
| Knoop Hardness [kg/mm$^2$] | 720 | 2200 | 1800 | 1600 | 580 |

TABLE 3

Properties of RF Materials

| Property (Units) | ZnS | Sapphire | Fused Silica | Pyroceram 9606 | Si3N4 |
|---|---|---|---|---|---|
| Dielectric constant | 8.4 | 9.4-11.6 | 3.3 | 5.5 | 8-9 |
| Loss tangent | $2.4 * 10^{-3}$ | $5.5 * 10^{-5}$ | $2 * 10^{-5}$ | $3 * 10^{-4}$ | $2 * 10^{-3}$ |
| Hardness [GPa] | 2.5 | 22 | 5 | 7 | 15 |
| Strength [MPa] | 103 | 300 | 48 | 300 | 620-1100 |
| Young's Modulus [GPa] | 74 | 344 | 34-55 | 110 | 305 |
| CTE [$10^{-6}$ cm$^{-1}$] | 7 | 5.3 | 0.6 | 5.7 | 3-3.4 |
| Thermal Conductivity [W/m-K] | 17 | 36 | 0.8 | 3.3 | 9-30 |

Temperature adversely affects a window in three ways. The first is that most electromagnetically transparent window materials absorb some of the electromagnetic signal passing through the window, and this absorption increases with the temperature of the window. For example, a 0.8 cm thick ms-ZnS window at room temperature absorbs 9% of the LWIR energy passing through it. However, at 150° C., it will absorb 15% of the energy passing through and at 600° C., it is expected that 29% of the energy passing through is absorbed. The second is that, like any surface at elevated temperature, the window radiates far more energy, and at the higher temperatures the energy radiated actually limits performance more than wavelength absorption. Using the definition of normalized Target Acquisition Range (TAR) as the actual TAR (i.e., the distance that a target becomes acquired by a sensor through a window) divided by the unencumbered or ideal TAR (i.e., the distance at which a target is acquired if no window were present), at a window temperature of 600° C., the actual TAR is reduced to only 48% of the ideal TAR (normalized TAR is 0.48). The third is that many materials will oxidize or decompose at high temperatures, rendering the window opaque to the electromagnetic wavelength of interest or even destroying the window entirely. It is well known in the art that, for sensor windows to be used in hypersonic applications, active cooling is absolutely necessary. Up until our present invention, however, the problem of useful active cooling had not been solved.

Our invention is specifically engineered so that for IR wavelengths of the sensed or monitored EM spectrum that happens to strike the heat transfer passages, rather than the window area between the passages, is not transmitted through the passages. For other wavelength applications, such as RF, where electrical conductivity of the material has a shielding effect, the passages or void space created in the material effects the shielding and therefore the passages can be designed to achieve the desired overall conductivity of the material with the included passages. That is the passage can be thought of as a form of "material doping." Note that in semiconductor production, doping is the intentional introduction of impurities, (in this case voids or passages filled with coolant) into an intrinsic semiconductor (and the materials being disclosed are semiconductors) for the purpose of modulating the electrical, optical and/or structural properties.

For IR applications, to improve image quality and to avoid distortion, we have been able to avoid passing the wavelengths of light of interest to the sensor or being monitored through the heat transfer passages and to assure that they pass only through the area where there are no heat transfer passages. The heat transfer passages are configured to be non-transparent to the wavelengths being sensed or monitored by, for example, applying a coating to the inside surfaces of the passages, using passages with opaque walls (such as hollow cores as described below) and/or other techniques for preventing transmission. Even if the liquid coolant fluid is already opaque, in a two-phase coolant application, the vapor may not be transparent, or the different index of refractions between the liquid and vapor coolant can lead to signal distortion, noise in the sensed signal, and other perception issues. For these IR applications our invention allows the use of any evaporating two-phase fluid, transparent or non-transparent, because of the absorbing coating or other type of coating that is applied to the inside of the passage walls to make the surface non-transparent and/or absorb any electromagnetic waves at the sensor wavelength, and thereby provide a clear sensor signal while avoiding any perceptive signal noise caused by any altered transmission of the wavelengths through the passage and to the sensor. This coating on the inside surfaces, as well as exploiting any inside passage surface finish benefits that can be obtained by our core manufacturing process, avoid any issues associated different indexes of refraction at the passage's fluid-solid interface or evaporating liquid-vapor interface.

Likewise, for RF applications altering the electrical conductivity of the coolant, as well as the number, spacing, size, and shape of the coolant passages will alter the overall electrical conductivity of the window and thus the RF transmittance. In addition, the use of an electrically conductive coating that is applied to the inside of the passage walls to make the wall surface electrically conductive represents another means to alter the electrical conductivity of the material without the need to or in addition to altering the conductivity of the coolant.

Our invention also allows the use of two-phase evaporation of the working fluid which results in far lower mass flow rates, improved temperature uniformity along the passage length, and significantly higher heat transfer coefficients, which for example permits, if needed, in the case of IR windows the use of smaller (optically opaque to the sensed wavelengths) passages, making less of the window frontal area non-transparent to the signal being monitored or sensed. By way of example, one currently preferred embodiment of our invention uses two-phase water coolant in an ms-ZnS LWIR window, where the heat transfer passage geometry has been optimized for LWIR operation. The ZnS window material is modified to be water-free by a known hot isostatic pressing process thereby forming ms-ZnS. This embodiment has similar calculated performance relative to an uncooled LWIR window up until the uncooled window begins to oxidize at 650° C. and is rendered useless, demonstrating that active cooling is essential. Our heat transfer passages in the LWIR window have been shown to reduce the actual TAR of the sensor located behind the window to half the ideal TAR when operating at room temperature.

In an RF window or radome, the longer EM wavelengths do not interact strongly with the passages that have not been conductivity enhanced or contain a conductive heat transfer passage coolant. However, electromagnetic shielding and the wavelengths that are shielded is accomplished by blocking the electromagnetic field with barriers made of conductive materials. The effect of the doping of non-conductive or in this case semiconductor materials with conductive materials to affect the shielding is well known in the art. For example, see NASA Contractor Report 4784 "Design Guidelines for Shielding Effectiveness, Current Carrying Capability, and the Enhancement of Conductivity of Composite Materials." The cooling geometry is designed to ensure that the window or radome can survive the relevant environment and that the resulting RF properties of the bulk RF window or radome has the desired RF transmission properties at the desired wavelength.

We have also found that, by using two-phase evaporative water cooling to control the window temperature instead of single-phase sensible water cooling, our system achieves both improved isothermality, and requires that the volume of coolant needs to be only 1% of the volume that would be required for a single-phase water system that exhibits the same thermal performance. Our invention is able to use far smaller passages without experiencing an excessive and unwanted pressure drop, as well as a far smaller liquid water reservoir in the case of an open system, and far smaller overall system in the case of a closed vapor compression system or two-phase pumped loop system. We have also found that even the use of two-phase ammonia evaporation as an alternative two-phase coolant in our invention will increase the actual TAR by 20% (i.e., by a factor of 1.2) although the volume of cooling fluid required is increased by a factor of 3.

Figure 6:
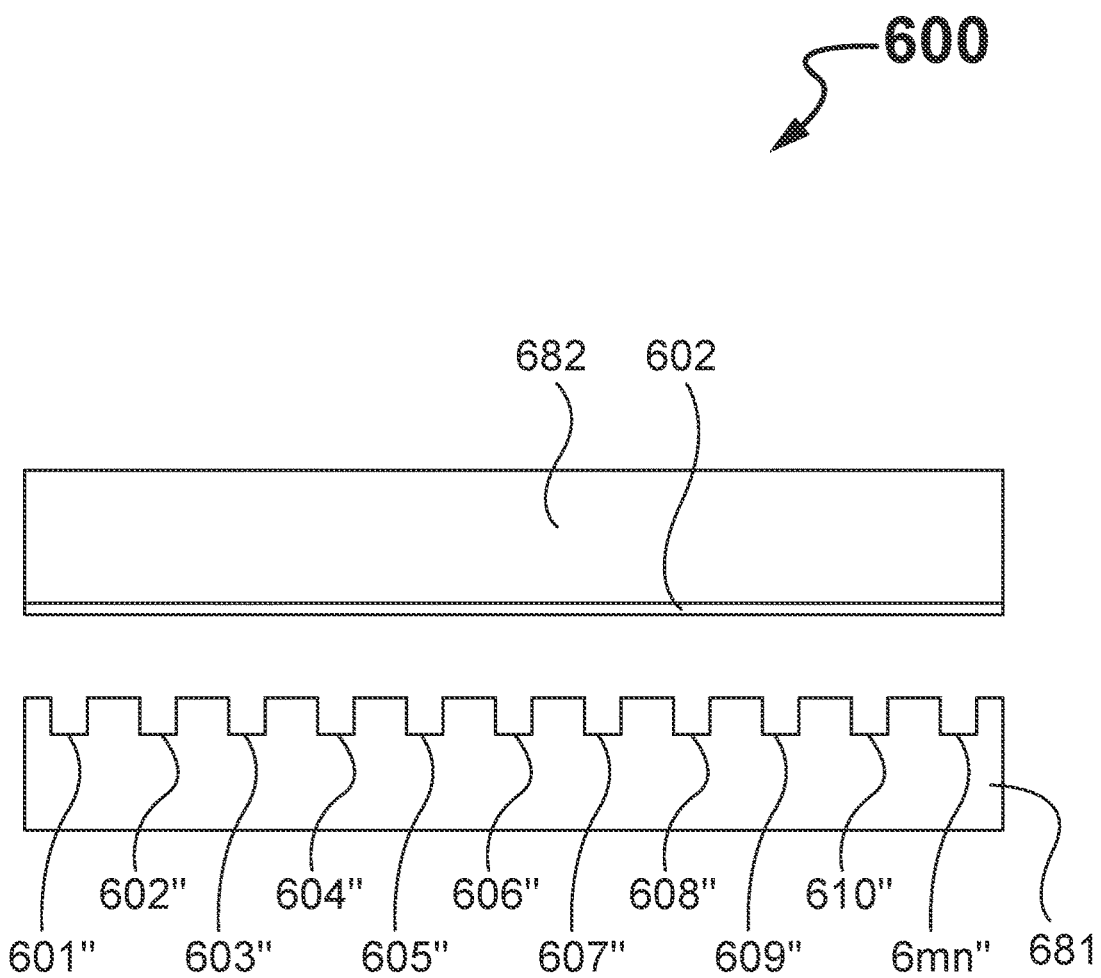
FIG. 6 is an isolated schematic view of an embodiment of our invention in which an internally cooled EM spectrum window or radome is fabricated from multi-spectral zinc sulfide (ms-ZnS) or single-crystal Zinc Sulfide plate-like material.
Figure 7A:
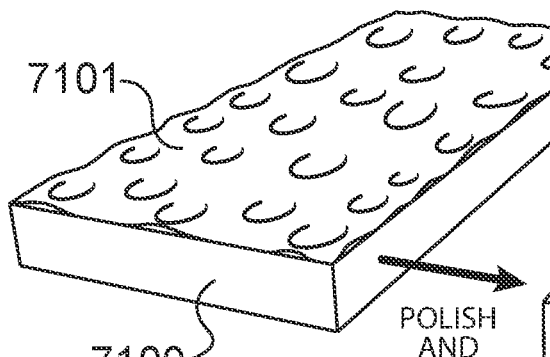
FIGS. 7(a)-(d) show a currently contemplated electromagnetic window or radome fabrication method according to our invention to obtain high aspect ratio inner channels by CVD growth, after polishing, continuing after placement of a selectively removable core-channel forming material.
Figure 7B:
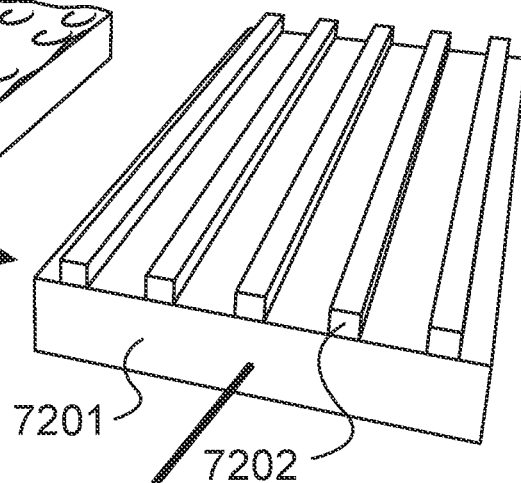
Figure 7C:
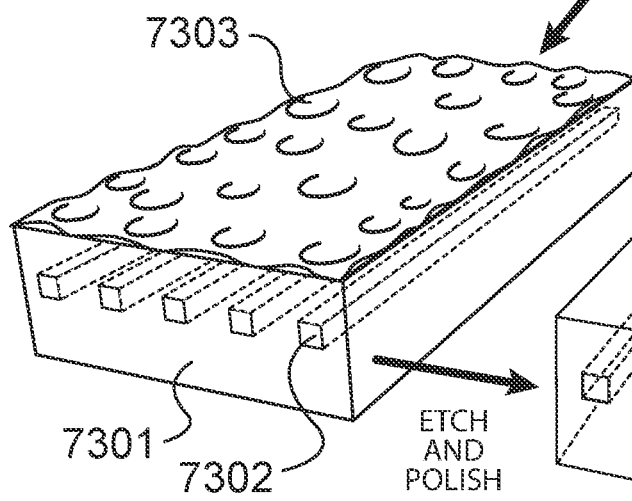
Figure 7D:
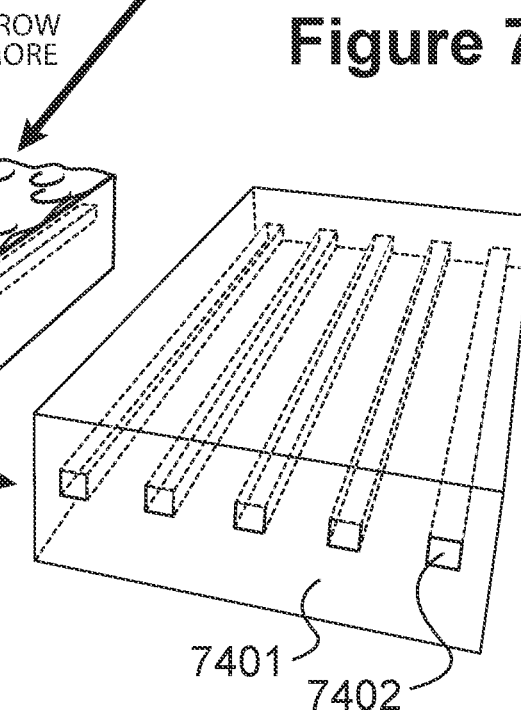

FIG. 6 shows an embodiment of our internally cooled window that has been fabricated from plate-like material, transparent to the EM wavelengths being sensed or monitored. A window 600 with internal flow passages is formed by bonding a base plate 681 with a cover plate 682. The base plate 681 has uniform internal coolant passages 601" through 6$mn$" machined into the surface of the base plate 681. While the cover plate 682 can also be machined with fluid passage grooves, a flat cover plate 602 is bonded to the base plate 681 in the illustrated embodiment to form the passages 601" through 6$mn$". By way of one specific example, we manufactured 4.7 inch (long)×4.1 inch (wide) windows that can be used in the FIG. 3, 4, or 5 embodiments from both ms-ZnS and single-crystal zinc sulfide material. Each window contained thirty-three coolant passages of 0.020 inch (0.5 mm) width×0.060 inch (1.5 mm) depth, i.e., with a hydraulic diameter of 0.030 inch (0.75 mm), and a passage length of 4.7 inches (119.4 mm). The inlet of each of these flow passages contained identical inlet capillary flow restrictions with a reduced hydraulic diameter section that spanned the initial 0.109 inch (2.77 mm) length of the inlet passage. The diameter of the reduced hydraulic section creating the upstream flow restrictions in the window heat transfer passages varied from 0.007 inch (0.178 mm) to 0.0105 inch (0.267 mm). While rectangular windows have been shown in the figures and in this example, one skilled in the art will now recognize, that the window or radome geometry could be square, round, oval or essentially any shape. Likewise, one skilled in the art will now recognize, that the heat transfer passages could be round, square, rectangular, triangular or essentially any shape.

In addition to the use of adhesives to bond window plates together to form the coolant passages, if the two surfaces are highly polished and if the particular window configuration would allow edge clamping or mechanical fixturing to hold the two polished surfaces mechanically together, these polished surfaces would not leak and can be used to form an actively cooled window. Furthermore, the window plates could be bonded via optical contacting or diffusion bonding processes which are well known in the art.

We have discovered that, for IR applications after the heat transfer passages are fabricated, the preferred method is to etch a rough surface, oxidize the surface, and/or deposit an optical absorbent material on the inside surfaces of the heat transfer passages so that any IR that hits the heat transfer passages is either completely or partially absorbed or scattered rather than being transmitted through the coolant passages which might cause sensor discrimination issues.

We have also discovered that, for RF applications after the heat transfer passages are fabricated, one option is to etch a rough surface and deposit an electrically conductive material on the inside surfaces of the heat transfer passages so the RF transmissivity and shielding of the window or radome can be tuned to the desired wavelengths. This will allow unwanted RF wavelengths which might cause RF sensor discrimination issues to be shielded.

Our preferred method of producing the window is to grow the window material around a solid or hollow core, to form the desired passages. An example of a growth method is chemical vapor deposition (CVD) of group II/VI compounds, such as zinc sulfide. If the core is hollow and non-transparent to the signal being sensed or monitored, the core can be used as the channel. If the core is solid, the core can be removed, still allowing conversion, treatment, or coating of the surface. The core can be chosen such that it can be removed selectively by an etching process, thus leaving one or more passages for coolant flow. Acids attack most group II/VI CVD grown materials, therefore materials which can be dissolved by a base solution are preferred for the core material. The core to be selectively etched can be a metal such as aluminum so as to be selectively removed with an aqueous copper chloride solution. Inasmuch as an amphoteric material can be dissolved by an acid or base, one such as aluminum oxide or copper can be chosen for the core material and dissolved with a base such as aqueous sodium hydroxide. Further, if the core is not adherent to the window (or radome) material and has a coefficient of thermal expansion (and contraction) greater than that of the window (or radome) material then the core material may be removed by cooling (the window and core) and then pressing the core out of the window with simple mechanical force (if the core extends to the edges of the window).

Alternatively, since the radome or window can be produced by forming a body from a population of nanoparticles, depositing a covering layer of ZnS powder on the body and sintering the covered body to produce a sintered product, the core can be imbedded into the body, that is formed around the core. In this way, after the sintering of the green body, the core can then be mechanically or chemically removed, in the same or similar fashion used in the CVD fabricated window with internal coolant passages.

For window and radome designs where the individual passages extend to the edges of the material (after core removal), the coolant passages interface with both inlet and outlet manifolds external to the window. Alternatively, the core can be configured to contain both the inlet and outlet manifolds, in addition to the individual passages, and the entire core totally encapsulated by the grown window (or radome) material, so that the inlet and outlet passageways can be later drilled from the window exterior into the inlet and outlet manifolds (from either the top, bottom, or edges) to allow the etching solution to remove the core through these inlets and outlets that were created by drilling. We have also found that the window can be machined and/or the core removed by chemical dissolution either before or after the machining and/or hydrostatic pressing operations.

One currently contemplated method to form the material around a selectively removable core is shown in FIGS. 7(a)-(d) and designated generally by the numeral 7000. In this embodiment, a group II/VI material 7100 is grown by CVD to a desired thickness. If a very thick layer is grown and "alligator skin" effect of large surface moieties 7101 form (a), then they must be polished to obtain a flat surface. Stopping CVD growth, followed by polishing and then continuing CVD growth was previously demonstrated by Purohit et. al. when growing ZnS on CVD-grown ZnSe. [1: Purohit, Kirsch and MacDonald; *Method for preparing laminates of ZnSe and ZnS*. 1990]. In addition, gas or solution phase chemical treatment may be employed to functionalize the surface for continued, or a second, CVD growth step of the material. Prior to the second CVD growth step a core material 7202 is placed (supported or unsupported by a frame) atop the polished CVD grown substrate 7201. Then CVD growth is continued around the core to form a core-containing CVD blank 7301 (c). The cores (only one being designated by numeral 7302) then can be removed by chemical etching or mechanical processing, leaving behind fluid flow passageways or channels (only one in (d) being designated by numeral 7402) in the CVD blank 7401 that may require additional polishing of the "alligator skin" moieties 7303 of the type also shown in FIG. 7c. Once the core is removed, the interior surfaces of the channels or passages can be treated. For example for IR windows and radomes to make them completely or partially non-transparent to the sensed or monitored wavelengths, such as treating them for IR or RF absorbance. For RF windows, the optional treatment would be to make the passage wetted surfaces electrically conductive.

Another contemplated novel method for implementing our invention designated generally by numeral 8000 is to form the material around a selectively removable core and to potentially remove the need for polishing the moieties 7101 in FIG. 7. As shown in FIGS. 8 (a)-(e) the CVD starter blank is grown from a single crystal, atomically smooth, wafer 8201 with the core material 8202 already affixed to the wafer surface (a). After sufficient growth occurs, the core-containing CVD crystal 8304 (b) can be cleaved from the wafer 8301 to leave behind a core/host piece 8304 with a near-atomically smooth surface 8305 so that the piece can then be flipped (c) and CVD growth on the smooth side 8305 can continue without the need for mechanical polishing or treatment (d). After completion of growth, the core material 8302 can be removed as previously discussed and any moieties 8303 on the outer surface can be polished, leaving behind a CVD grown structure 8401 with open channels 8402 (e).

Yet another currently contemplated method is to begin with a slab of the ZnS (either multispectral or single crystal) or some other suitable window material as previously listed and discussed, and then optionally polished one or both surfaces. One or more fluid passage forming cores are then placed on the slab, and material is formed around the selectively removable core. In this embodiment, a group II/VI material is grown by CVD to a desired thickness around the core forming a complete window. As stated before, if a very thick layer is grown and "alligator skin" effect of large surface moieties form, then these moieties can be polished to obtain a flat surface. Once again, gas or solution phase chemical treatment may be employed to functionalize the slab surface for the CVD growth step of the material. While our currently preferred embodiment is to grow the same group II/VI material as the base slab material, the base material and the grown material could be different a group II/VI materials, and other methods to build up the material over the cores in addition to CVD can be used. For RF applications where the overall electrical conductivity of the window or radome is being fine-tuned, the use of a different material allows for additional design options.

Another window material growth method could employ sintering host particles together to a poly- or single-crystalline structure as performed by Ravichandran et. al. [2: Ravichandran and Shi; *Polycrystalline sintered nano-gran zinc sulfide ceramics for optical windows*. (U.S. Pat. No. 8,803,088 B1)], by only hot isostatically pressing the particles around the core material and following similar removal procedures such as mechanical force or selective chemical etching.

Other variations in the method of adding inlet and outlet manifolds can be employed either external or internal to the window or radome. In the case of materials such as ms-ZnS, the hot isostatic pressing can be performed after the window, with its internal passages, has been created and before or after the core is removed by etching or other known techniques. The surface finish or surface treatment of the coolant passages can be adjusted to the desired surface finish inside the passages after the core is removed. The inside surfaces of the passages can utilize any non-transparent, electrically conductive, or absorbing coating, and one way to deposit this coating on the interior surfaces of the passages is by flowing a carrier liquid (with the coating in solution) through the passages, then evaporating the carrier liquid, with or without the addition of heat, to leave the coating bonded to the interior surfaces of the coolant passages. Inlet flow restrictions in the window can also be formed by the core by creating a core where the inlet section of the core has a reduced hydraulic diameter, or recessed section to form a weir, or other partial obstruction, so that, after core removal, a smaller inlet flow cross-sectional area in the inlet section in the passageway has been created.

We have discovered that chemical vapor deposition (CVD) is one effective way of growing the ms-ZnS window with internal passages. The growth rate is 50-75 µm/h, making the fabrication method economically viable as well as technically feasible. One skilled in the art will now understand that, while the actively cooled window discussed here is an electromagnetic wavelength window that allows a sensor located behind the window to transmit or receive electromagnetic signals in the desired wavelengths while being protected from the very high environmental temperatures and aerodynamically induced thermal loads while flying at high speeds, this same window cooling technology has other applications for both window heating or window cooling where a perceptively transparent window is exposed to high or low temperature environments or excessive heating or cooling loads. Of course, one skilled in the art will further understand that for heating loads, condensation rather than evaporation would be used to heat rather than cool the window. For example, the present invention is useable for windows for human-viewing or senor-viewing from structures located in extreme environments, such as extraterrestrial planetary missions, spacecraft reentry sensors, specialty high temperature furnace sensor applications, high temperature geological investigations and the like.

While currently preferred embodiments of the invention have been illustrated and described, variations will be apparent to one skilled in the art without departing from the principles of the invention described herein. Therefore, we do not intend to be limited to the details shown and described above but intend to cover all such changes and modifications as are encompassed by the scope of the appended claims.

We claim:

1. A method for producing a window member comprised of a material having a selected transparency to the electromagnetic wavelengths to be monitored or sensed and at least one heat transfer passage arranged within the window member and is for containing a heat transfer fluid, comprising:
   (a) providing a core around which the window member material is grown; and
   (b) removing the core to produce the at least one heat transfer passage;
   wherein an inside surface of the heat transfer passage is treated to be non-transmissive to the monitored or sensed electromagnetic wavelengths.

2. The method of claim 1, wherein the core is comprised of a material allowing at least one of (i) the core to be mechanically removed after growth of the window member material surrounding the core and (ii) the core to be chemically removed after growth of the window member material surrounding the core.

3. The method of claim 1, wherein production of a surface finish on interior surfaces of the at least one heat transfer passage is produced by a surface finish on the exterior surface of the core.

4. The method of claim 1, wherein growing of the window member material is performed by chemical vapor deposition.

5. The method of claim 1, wherein removal of the core is performed by chemical etching.

6. The method of claim 1, wherein the core forming the at least one heat transfer passage is configured to have a reduced hydraulic diameter in the inlet region to form an inlet flow restriction in the passage once the core is removed.

7. A method for producing a window member comprised of a base material having a selected transparency to the electromagnetic wavelengths to be monitored or sensed and at least one heat transfer passage arranged within the window, comprising:
   (a) locating a core on the base material;
   (b) growing around the core a material which is one of the same material as the base or another material having a selected transparency to the electromagnetic wavelengths to be monitored or sensed;
   (c) removing the core to produce the at least one heat transfer passage; and
   (d) treating the at least one heat transfer passage to be non-transmitting to the monitored electromagnetic wavelengths.

8. The method of claim 7, wherein a surface finish on an interior surface of the at least one heat transfer passage is produced by a surface finish on the exterior surface of the core.

9. The method of claim 7, wherein the growing of the window member material is performed by chemical vapor deposition.

10. The method of claim 7, wherein removal of the core is performed by chemical etching.

11. The method of claim 7, wherein the non-transmitting passage is produced by depositing a non-transmitting material on inside surfaces of the at least one heat transfer passage.

12. The method of claim 11, wherein the non-transmitting material is an absorbent material that is deposited by flowing a carrier fluid with the absorbent material in solution through the at least one heat transfer passage, and then evaporating the carrier fluid from the passages.

13. The method of claim 7, wherein the core forming the at least one heat transfer passage is configured to have a reduced hydraulic diameter in the inlet region to form an inlet flow restriction in the passage after the core has been removed.

14. A method for producing a window member comprised of a base material having a selected transparency to the electromagnetic wavelengths to be monitored or sensed and at least one heat transfer passage arranged within the window, comprising:
   (a) locating a core on the base material;
   (b) growing around the core a material which is one of the same material as the base or another material having a selected transparency to the electromagnetic wavelengths to be monitored or sensed;
   (c) removing the core to produce the at least one heat transfer passage; and
   (d) treating the at least one heat transfer passage to produce a non-transmitting heat transfer passage to the monitored electromagnetic wavelengths.

15. The method of claim 14, wherein a surface finish on an interior surface of the at least one heat transfer passage is produced by a surface finish on the exterior surface of the core.

16. The method of claim 14, wherein the growing of the window member material is performed by chemical vapor deposition.

17. The method of claim 14, wherein removal of the core is performed by chemical etching.

18. The method of claim 14, wherein the non-transmitting passage is produced by depositing a non-transmitting material on inside surfaces of the at least one heat transfer passage.

19. The method of claim 18, wherein the non-transmitting material is an absorbent material that is deposited by flowing a carrier fluid with the absorbent material in solution through the at least one heat transfer passage, and then evaporating the carrier fluid from the passages.

20. The method of claim 14, wherein the core forming the at least one heat transfer passage is configured to have a reduced hydraulic diameter in the inlet region to form an inlet flow restriction in the passage after the core has been removed.

* * * * *